United States Patent
Wei et al.

(10) Patent No.: US 10,883,193 B2
(45) Date of Patent: Jan. 5, 2021

(54) METHOD FOR PREPARING PEROVSKITE CRYSTAL

(71) Applicant: NATIONAL TSING HUA UNIVERSITY, Hsinchu (TW)

(72) Inventors: Tzu-Chien Wei, Hsinchu (TW); Ko-Chi Teng, Hsinchu (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 157 days.

(21) Appl. No.: 15/866,629

(22) Filed: Jan. 10, 2018

(65) Prior Publication Data
US 2018/0334759 A1    Nov. 22, 2018

(30) Foreign Application Priority Data
May 19, 2017 (TW) .............................. 106116661 A

(51) Int. Cl.
| | | |
|---|---|---|
| C30B 29/32 | (2006.01) | |
| B01D 9/00 | (2006.01) | |
| C30B 7/14 | (2006.01) | |
| C30B 33/02 | (2006.01) | |
| C30B 29/12 | (2006.01) | |

(52) U.S. Cl.
CPC ............ C30B 29/32 (2013.01); B01D 9/0036 (2013.01); C30B 7/14 (2013.01); C30B 29/12 (2013.01); C30B 33/02 (2013.01)

(58) Field of Classification Search
CPC ....... B01D 9/0036; C30B 29/12; C30B 29/32; C30B 33/02; C30B 7/14
See application file for complete search history.

(56) References Cited

U.S. PATENT DOCUMENTS

2010/0140569 A1    6/2010  Wu et al.

FOREIGN PATENT DOCUMENTS

| CN | 104372412 A | 5/2015 |
| CN | 105514276 A | 4/2016 |
| CN | 106283195 A * | 1/2017 |

(Continued)

OTHER PUBLICATIONS

Nayak et al (Nature Communications, 7:13303 | DOI: 10.1038/ncomms13303, 2016 (Year: 2016).*

(Continued)

*Primary Examiner* — Hua Qi
(74) *Attorney, Agent, or Firm* — Li & Cai Intellectual Property (USA) Office

(57) ABSTRACT

The instant disclosure provides a method for preparing a perovskite crystal, including a mixing step, a crystallization step, a diluting step and a recrystallization step. The mixing step includes adding a first precursor and a second precursor into a solvent for forming a supersaturated solution. The crystallization step includes stirring the supersaturated solution for initiating a reaction between the first and second precursors in the supersaturated solution to form a perovskite powder in a solution. The diluting step includes adding the solvent to the solution and stirring the solution for dissociating the perovskite powder in the solution to form a clear solution. The recrystallization step includes adding a crystal seed into the clear solution for initiating a crystallization process on the crystal seed and forming the perovskite crystal.

18 Claims, 9 Drawing Sheets

(56) References Cited

FOREIGN PATENT DOCUMENTS

| CN | 106283195 A | 1/2017 |
|---|---|---|
| CN | 106637403 A | 5/2017 |

OTHER PUBLICATIONS

Dongdong Dong, et al., "Bandgap tunable $Cs_x(CH_3NH_3)_{1-x}PbI_3$ perovskite nanowires by aqueous solution synthesis for optoelectronic devices", Nanoscale, Journal, p. 1567-1574, www.rsc.org/nanoscale, Royal Society of Chemistry.

* cited by examiner

METHOD FOR PREPARING PEROVSKITE CRYSTAL

BACKGROUND

1. Technical Field

The instant disclosure relates to a method for preparing a crystal, and particularly, to a method for preparing a perovskite crystal.

2. Description of Related Art

In order to solve the environmental problems caused by conventional fossil fuel, governments and industries have been devoted to the development of alternative energies. Among the alternative energies, solar energy undoubtedly receives large attention. Currently most of the commercially available solar cells are silicon-based. However, since the manufacturing process of the silicon-based solar cells still has pollutions and efficiency problems, the industry keeps working to develop new types of solar cells with higher efficiency and lower cost.

Among the new types of solar cells, thin film solar cells with perovskite crystal structure have received large attention in recent years. New studies indicate that a single crystal having "perovskite crystal structure" has very high light absorption coefficient, long carrier diffusion length and extremely low trap density and is suitable not only in the solar cell material application but also in the laser material and light-emitting material applications. Therefore, a crystal having "perovskite crystal structure" becomes a popular target material to be studied in the academia and the industry.

Though the term "perovskite" is generally referred to a calcium titanium oxide mineral composed of calcium titanate ($CaTiO_3$), the perovskite crystal employed in a perovskite solar cell generally does not include elements such as calcium (Ca) and titanium (Ti). Instead, it is a material having perovskite crystal structure and including elements such as lead (Pb), iodine (I), carbon (C), nitrogen (N), hydrogen (H), etc. For example, methylammonium lead iodide ($CH_3NH_3PbI_3$, referred to as $MAPbI_3$) or methylammonium lead bromide ($CH_3NH_3PbBr_3$, referred to as $MAPbBr_3$) are materials having perovskite crystal structures. In other words, the perovskite solar cells mostly employ lead-based perovskite crystals. For the convenience of description, in the following contents of the present disclosure, the crystals having "perovskite crystal structure" but not necessarily including calcium (Ca) and titanium (Ti) are referred to as a "perovskite crystal".

The perovskite crystals employed in solar cells may be prepared by inverse temperature crystallization (ITC) which utilizes the inverse temperature solubility of the perovskite crystals, i.e., the property of the perovskite crystals that when the temperature increases, the solubility of the perovskite crystals decreases. Inverse temperature crystallization is described in, for example, a paper proposed by Makhsud I. Saidaminov et al., entitled "High-quality bulk hybrid perovskite single crystals within minutes by inverse temperature crystallization" published in Nature communication. However, the preparation of the perovskite crystals of the existing art still includes disadvantages that need to be overcome.

In addition to the paper mentioned above, a process for preparing perovskite crystal by increasing the temperature to induce crystallization is disclosed in patent publications such as China patent publication No. 104911705A, entitled "Process for producing $ABX_3$ perovskite crystal in low temperature solution". The above patent publication discloses the preparation of a single crystal growing solution including halides and metal compound and performing a continuous growing method to obtain an $ABX_3$ perovskite single crystal. China patent publication No. 105405979 A entitled "preparation of organic-inorganic doping perovskite single crystal" discloses the preparation of a precursor solution and heating the solution for precipitating the crystals. However, in the above two patent publications, the preparations of the single crystal growing solution and the precursor solution take a lot of time. For example, it may take 12 hours to enable the precursors to be sufficiently dissolved in the solvent. Alternatively, in the existing art, an additional step such as filtering may be necessary to remove the precursor that is not dissolved in the solvent. In other words, the inverse temperature crystallization in the existing art still includes some disadvantages.

Reference is made to FIG. 1. In an inverse temperature crystallization process, a perovskite crystal precursor P (such as methylammonium iodide and lead iodide) is added into a solvent with a specific temperature (e.g., 70° C., as shown in step (a) of FIG. 1) to form a solution having a concentration of 1.3 M (which is an unsaturated solution), and the solution is stirred to enable the precursor P to dissolve in the solvent and form a completely clear precursor solution. Next, in step (b), a crystal seed C is added. In step (c), the temperature is increased to evaporate the solvent and to initiate the crystallization process while maintaining the concentration of the precursor solution saturated. However, in order to enable the precursor which is difficult to dissolve in the solvent (such as lead iodide) to be completely dissolved in the solvent, step (a) may take 2 hours or more.

In addition to the problems mentioned above, the existing inverse temperature crystallization process further includes the following disadvantage: in the product obtained by the crystallization process, many small perovskite crystals may be dispersed in the solution and have irregular shapes. These small perovskite crystals are formed by a plurality of nucleation sites in the solution which compete with the main nucleation point (the crystal seed) for the precursors in the solution, thereby reducing the crystallization rate on the crystal seed. Therefore, it is more difficult to form a perovskite crystal with a large size in a short period of time. Accordingly, there is a need for an improved method for preparing perovskite crystals.

SUMMARY

The object of the instant disclosure is to provide a method for preparing perovskite crystals which may significantly reduce the time for forming a clear solution containing the precursors and increase the regularity of the crystals and the speed of crystallization.

In order to achieve the above object, an embodiment of the instant disclosure provides a method for preparing a perovskite crystal including a mixing step, a crystallization step, a diluting step and a recrystallization step. The mixing step includes adding a first precursor and a second precursor into a solvent for forming a supersaturated solution. The crystallization step includes stirring the supersaturated solution for initiating a reaction between the first precursor and the second precursor in the supersaturated solution to form a perovskite powder in a solution. The diluting step includes adding more of the solvent to the solution and (simultaneously) stirring the solution for dissociating the perovskite powder in the solution to form a clear solution. The addition of the solvent can be carried out while stirring the solution. The recrystallization step includes adding a crystal seed into the clear solution for initiating a crystallization process on the crystal seed and forming the perovskite crystal.

The method for preparing a perovskite crystal provided by the instant disclosure could significantly reduce the time for forming a clear solution containing the precursors and increase the regularity of the crystal and the speed of crystallization.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
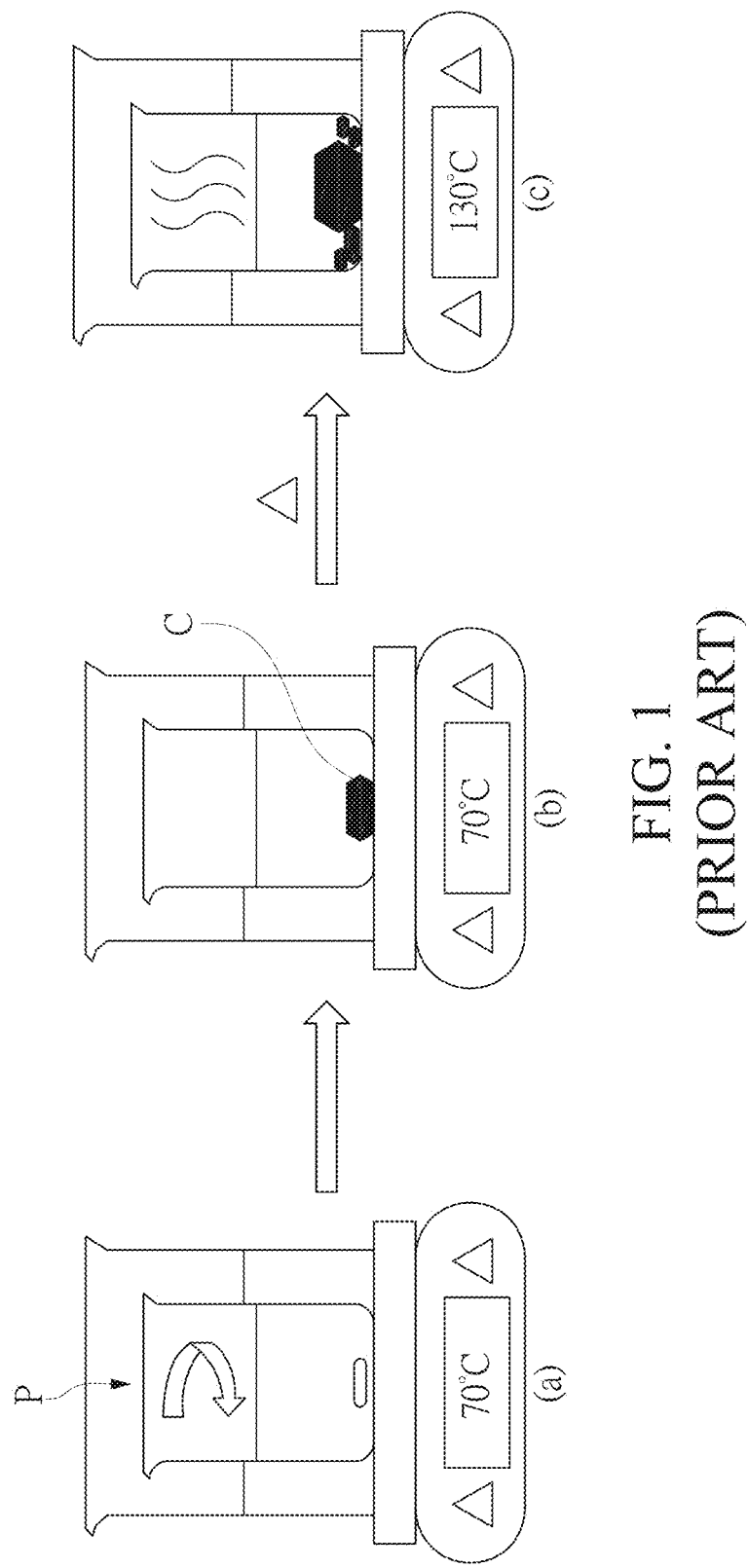
FIG. 1 is a flow chart of a method for preparing a perovskite crystal by an inverse temperature crystallization method of the existing art.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 2:
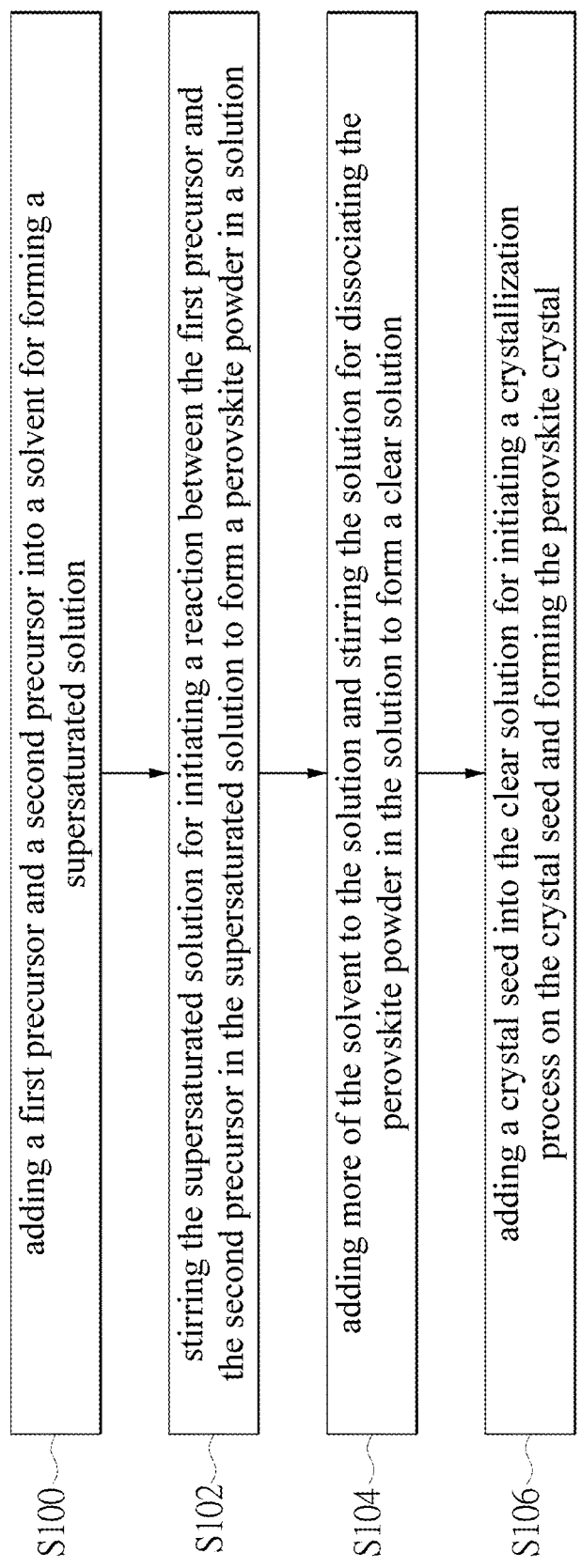
FIG. 2 is a flow chart of the method for preparing a perovskite crystal provided by the instant disclosure.

Reference is made to FIG. 2. The method for preparing a perovskite crystal provided by the instant disclosure includes: a mixing step (step S100) including adding a first precursor and a second precursor into a solvent for forming a supersaturated solution; a crystallization step (step S102) including stirring the supersaturated solution for initiating a reaction between the first precursor and the second precursor in the supersaturated solution to form a perovskite powder in a solution; a diluting step (step S104) including adding more of the solvent to the solution and simultaneously stirring the solution for dissociating the perovskite powder into the solvent to form a clear solution; and a recrystallization step (step S106) including adding a crystal seed into the clear solution for initiating a crystallization process on the crystal seed and forming the perovskite crystal.

Figure 3:
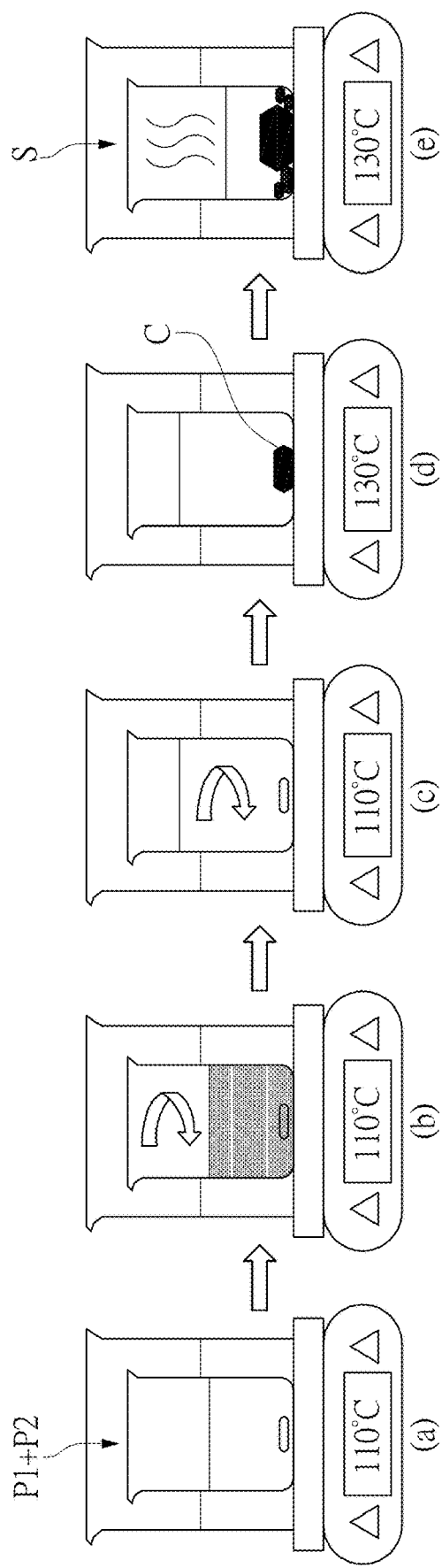
FIG. 3 is the schematic views of each step of the method for preparing a perovskite crystal provided by the instant disclosure.

Reference is made to FIG. 3. Step (a) of FIG. 3 corresponds to step S100 shown in FIG. 2. A first precursor P1 and a second precursor P2 are added to a solution for forming a supersaturated solution. Specifically, the first precursor P1 includes a halide represented by a general formula AX, and the second precursor P2 includes a metal halide represented by a general formula $MX_2$, in which A is selected from $CH(NH_2)_2$, $CH_3CH_2NH_3$, $CH_3NH_3$ and Cesium (Cs), M is lead (Pb) or Tin (Sn); X is chloride (Cl), bromide (Br) or iodine (I). In the instant disclosure, the first precursor P1 and the second precursor P2 may include more than one compound. In other words, the first precursor P1 could be a mixture including two or more compounds represented by the general formula AX, and the second precursor P2 may be a mixture including two or more compounds represented by the general formula $MX_2$.

In the following embodiments, the first precursor P1 is methylammonium iodide ($CH_3NH_3I$, referred to as MAI) and the second precursor P2 is lead iodide ($PbI_2$). However, different precursors (P1, P2) may be used in other embodiments.

In the instant disclosure, the solvent is γ-butyrolactone, dimethylformamide or a mixture thereof. The selection of the solvent may be made based on the species of the first precursor P1 and the second precursor P2. In the following embodiments, the solvent is γ-butyrolactone. The selection of γ-butyrolactone as the solvent may be preferred when MAI is selected as the first precursor P1 and lead iodide is selected as the second precursor P2 because these perovskite precursors have higher solubility toward γ-butyrolactone.

In step S100, a first precursor P1 and a second precursor P2 are added into a solvent to form a supersaturated solution, and the solvent is pre-heated through an oil bath. Step S100 (the mixing step) can be carried out with a temperature ranging from 57 to 204° C. For example, as shown in step (a) in FIG. 3, the temperature of the mixing step is 110° C. In addition, a stir bar may be disposed in the mixture of the first precursor P1, the second precursor P2 and the solvent, so in the subsequent steps it could be more convenient to stir the solution using the stir bar.

In step S100 of the method provided by the instant disclosure, the first precursor P1 and the second precursor P2 are added to the solvent with a molar ratio from 1:1 to 3:1. When the ratio of the first precursor P1 to the second precursor P2 falls outside of the above range, it may be more difficult for the precursors to be dissolved in the solvent. In a preferred embodiment, the molar ratio of the first precursor P1 to the second precursor P2 is about 1:1. In addition, it should be noted that in order to form a perovskite powder in the subsequent crystallization step, the amount of the first precursor P1 and the second precursor P2 added to the solvent should be enough so the solution could be supersaturated. For example, when the first precursor P1 is MAI, the second precursor P2 is lead iodide and the solvent is γ-butyrolactone, the amount of the first precursor P1 and the second precursor P2 could be enough for the solution to reach a concentration of 2.6 M. In the existing ITC method, the precursor P is added to the solvent to form an unsaturated solution (for example, with a molar concentration of 1.3 M, as shown in FIG. 1). In the instant disclosure, the first precursor P1 and the second precursor P2 are added to the solvent to form a supersaturated solution which could be beneficial to the formation of the perovskite powder, and then in the subsequent steps the perovskite powder is dissolved in the solvent to obtain a clear precursor solution.

Next, in step S102, the supersaturated solution is stirred for initiating the reaction between the first precursor P1 and the second precursor P2 for forming the perovskite powder. As shown in step (b) of FIG. 3, step S102 is the crystallization step including maintaining the supersaturated solution within a suitable temperature range and stirring the supersaturated solution for initiating the reaction between the first precursor P1 and the second precursor P2 to form a black powder with a perovskite structure. In the embodiments of the instant disclosure, the time required for stirring may be ranging from 5 to 10 minutes. In this embodiment, after reacting for about 5 minutes, black perovskite powder dispersed in the solvent is formed and after reacting for 10 minutes, yellow powder of lead iodide ($PbI_2$) completely disappears which indicates that the first precursor P1 and the second precursor P2 have completely reacted to form a product with perovskite structure. The black perovskite powder formed by the first precursor P1 (MAI) and the second precursor P2 ($PbI_2$) could be represented by $MAPbI_3$, which is methylammonium lead iodide.

Step S102 can be carried out with a temperature ranging from 57 to 204° C. In the embodiments of the instant disclosure, step S100 (the mixing step) and step S102 (the crystallization step) may be carried out with about the same temperature. The temperatures of step S100 and step S102 could be selected based on the species of the first precursor P1, the second precursor P2, the solvent, and other parameters, and are not limited to the instant disclosure.

Reference is made to FIG. 2 and FIG. 3. In step S104, the solvent is added to the perovskite powder while stirring the solution for dissolving the perovskite powder into the solvent and forming a clear solution. Specifically, as shown in step (c) of FIG. 3, step S104 is a diluting step including adding additional solvent used in step S100 into the perovskite powder formed in step S102 while and stirring the solution. Therefore, the black perovskite powder dissociates in the solvent and form the clear solution. The clear solution (which is completely clear) includes $MA^+$ and $PbI_n^-$, in which n=3, 4, 5 . . . .

In the instant disclosure, the diluted clear solution is an unsaturated solution. For example, the clear solution formed in step S104 has a molar concentration of 1.3 M. In addition, it should be noted that in step S104, stirring the solution is performed while adding the solvent. The step of stirring the solution including the solvent and the black perovskite powder could remove water contained among the solvent molecules. Specifically, in the existing preparation methods, using compounds such as γ-butyrolactone may lead to the presence of water from the reaction environment among the solvent molecules. If the water is not removed, the water may lead to other nucleation paths in the subsequent steps which involve a crystallization process, and hence, the crystals formed by the crystallization process will not only form on the main nucleation seed (crystal seed) but also on other nucleation sites. For example, the water remained in the solvent will evaporate when the temperature is above 100° C. and form bubbles in the solution containing γ-butyrolactone and initiate the nucleation of the crystals. In other words, in the precursor solution, in addition to the crystal seed, other nucleation sites would be presented. Therefore, the resources of the precursors are distributed into different nucleation sites and some formed crystals would not be concentrated on the crystal seed. Using dimethylformamide as solvent instead of γ-butyrolactone may also lead to the above water-remaining issue.

In order to solve the issue above, the instant disclosure provides a method in which a solvent is added to dilute the solution, and stirring is carried out toward the solution containing the solvent and the perovskite powder for removing water remained in the solution in step S104. In order to achieve satisfacory water-removing effect, step S104 (the diluting step) is carried out with a temperature ranging from 100° C. to 204° C. In addition, the temperature of step S104 may be about the same as the temperature of steps S100 and S102.

The time for carrying out step S104 may be from 5 to 10 minutes. In other words, after adding the solvent and stirring the solution for 5 to 10 minutes, all of the black perovskite powders would be dissolved (dissociated) in the solvent and a clear solution (i.e., the precursor solution for the crystallization process) is formed. In the instant disclosure, steps S100 to steps S104 may take only about 10 to 20 minutes. Comparing to the existing art (for example, the ITC method shown in FIG. 1), the required time for forming a clear solution of the instant disclosure may be reduced to ⅙-⅓ of the original required time.

Next, reference is made to FIG. 2 and FIG. 3. In step S106, the crystal seed C is added into the clear solution for initiating the crystallization process of the crystal seed C and forming perovskite crystal. Step S106 shown in FIG. 2 corresponds to step (d) and step (e) shown in FIG. 3. Specifically, the recrystallization step is performed after a clear solution is formed after step S104. As shown in step (d) of FIG. 3, the recrystallization step includes adding a crystal seed C prepared in advance (for example a $MAPbI_3$ crystal) into the clear solution. Subsequently, along with the evaporation of the solvent of the clear solution, the clear solution is remained a saturated concentration and the perovskite crystal starts to crystallize. As shown in FIG. 3, by adding the seed crystal C, the perovskite crystal are mainly formed on the crystal seed C during the continuous crystallization process. Other minor perovskite crystals are formed at other sites in the clear solution.

The recrystallization step is carried out with a temperature ranging from 80° C. to 204° C. As long as the temperature of step S106 is sufficient for the perovskite crystal to grow (crystallize), the specific temperature of step S106 could be adjusted according to the species of the first precursor P1, the second precursor P2 and the solvent. For example, when using different types of precursors, the crystals growing with different temperatures may have different phases. In the instant disclosure, the temperature of the recrystallization step may be changed as long as the formed crystals have the perovskite structure.

Figure 4:
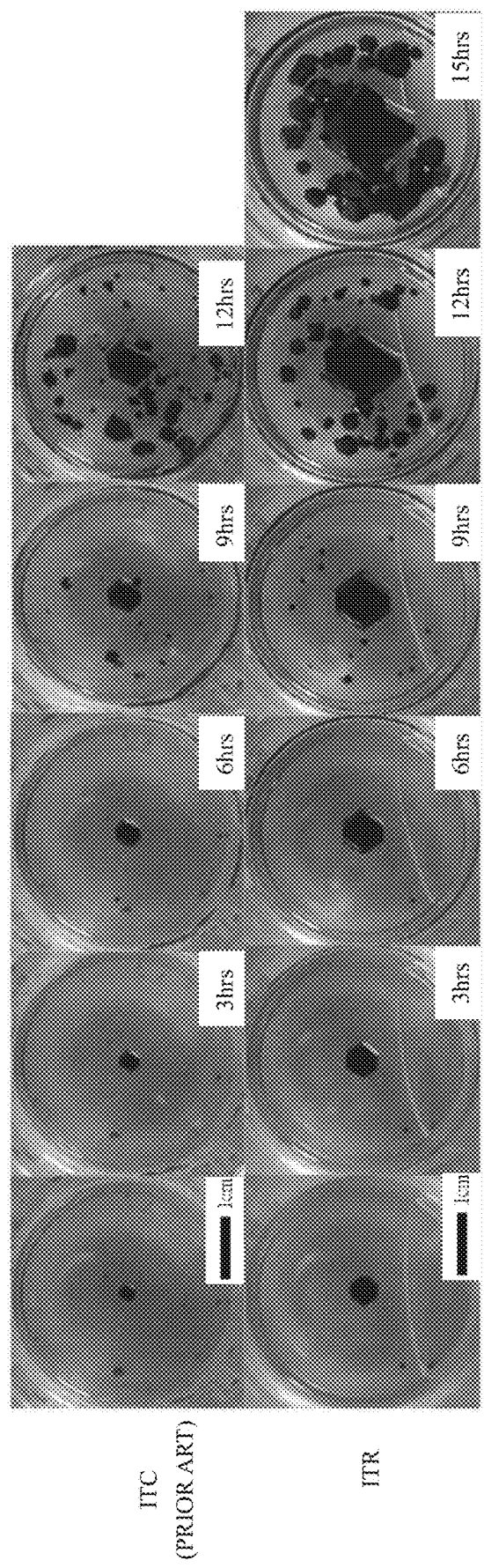
FIG. 4 shows the comparison between the speed of crystallizations of the method for preparing perovskite crystal of provided by the existing art and the instant disclosure.

Reference is now made to FIG. 4. FIG. 4 shows the comparison of the speed of crystallization between the method for preparing a perovskite crystal provided by the instant disclosure and the method used in the existing art. The five pictures on the top represent the states of the crystal grow as time passes during the ITC method of the existing art, and the six pictures on the bottom represent the states of the crystal grow as time passes during step S106 of the instant disclosure. In FIG. 4, the first precursor P1 is methylammonium iodide, the second precursor P2 is lead iodide and the solvent is γ-butyrolactone for both of the experiments.

In the experiments shown in FIG. 4, the pictures at the far left are taken at the time when the crystallization process starts. The timings for taking other pictures are shown in the pictures. Specifically, the time when the crystallization process starts is when a bright surface is presented on the crystal seed. As shown in FIG. 4, the method provided by the instant disclosure could provide perovskite crystals with higher regularity, and the resources (of the precursors) are more concentrated on the crystal seed, thereby enabling the formation of a larger perovskite crystal. For example, 12 hours after the crystallization process starts, the perovskite crystals formed by the existing ITC method not only form on the crystal seed but also form as perovskite crystals around the crystal seed having irregular shape and sizes. However, in the method provided by the instant disclosure, 12 hours after the recrystallization step starts, the perovskite crystals are mainly formed on the crystal seed (the amount of the crystals formed on the crystal seed is much more than the amount of the smaller crystals formed and distributed in the solution) and have more regular shape and size. In addition, 15 hours after of the recrystallization step starts, a perovskite crystal with a size larger than 1 centimeter could be formed.

The method for preparing perovskite crystals with different first precursors P1 and second precursors P2 are described below. The temperatures for each step and the species of the crystal seeds may need to be changed based on the species of the precursors.

First Experimental Example

In the first experimental example, the first precursor P1 is $CH(NH_2)_2I$ (Formamidinium Iodide, FAI) and the second precursor P2 is lead iodide ($PbI_2$). The solvent is γ-butyrolactone. In step S100, a molar ratio of 1:1 of $CH(NH_2)_2I$ and $PbI_2$ are added to a pre-heated γ-butyrolactone to reach a supersaturated (1.6 M) concentration. In step S102, the mixture containing the first precursor P1, the second precursor P2 and the solvent is stirred for initiating the reaction between the $CH(NH_2)_2I$ and $PbI_2$ and forming a black perovskite powder, i.e., α-$FAPbI_3$. Step S102 may take about 10 minutes, i.e., the yellowish $PbI_2$ powder disappeared after 10 minutes.

Next, in step S104, more γ-butyrolactone is added to the perovskite powder, and the solution is stirred for forming a clear solution. In the first experimental example, the concentration of the clear solution is 0.8 M and is an unsaturated solution. In step S106, a crystal seed is added, and black perovskite crystals grow on the crystal seed by the crystallization process while the solvent slowly evaporates from the mixture.

In the first experimental example, the temperatures of steps S100 to S106 are maintained at 165° C. Based on the phase change of $FAPbI_3$ obtained by XRD, a crystallization process carried out with a temperature higher than about 160° C. could ensure the product $FAPbI_3$ to have the desired perovskite structure, i.e., α-$FAPbI_3$. According to some experiments, at a temperature below 160° C., for example 130° C., the same process may produce needle-shaped product δ-$FAPbI_3$ (delta-phase $FAPbI_3$). Step S106 of the first experimental example is carried out at a temperature around 165° C., and the clear solution in light-yellow becomes orange.

The perovskite crystal obtained in the first experimental example could reach a size larger than 1 cm (centimeter) within one day. The results demonstrate that the method provided by the instant disclosure could produce perovskite crystals with larger size rapidly and effectively.

Second Experimental Example

In the second experimental example, a mixture of FAI and MAI is used as the first precursor P1; lead iodide ($PbI_2$) is used as the second precursor P2; γ-butyrolactone is used as the solvent.

In step S100, a molar ratio of 1:1 of a mixture of FAI and MAI, together with $PbI_2$, are added to a pre-heated γ-butyrolactone to become a supersaturated (1.8) solution. In step S102, the mixture containing the first precursor P1, the second precursor P2 and the solvent is stirred for initiating the reaction between the FAI/MAI mixture and $PbI_2$ and forming a black perovskite powder, i.e., $FA_xMA_{(1-x)}PbI_3$.

Comparing to the first experimental example, the second experimental example uses a different first precursor P1 (i.e., a mixture of FAI and MAI). Since the saturated solubility of $MAPbI_3$ toward the solvent is higher than the saturated solubility of $FAPbI_3$ toward the solvent, the saturated solubility of the mixture of $MAPbI_3$ and $FAPbI_3$ is higher than that of $FAPbI_3$ used in the first experimental example. Therefore, in the second experimental example, after adding more of the solvent, the concentration of the clear solution in step S104 may be 0.9 M and the clear solution is an unsaturated solution. Lastly, a crystal seed is added in step S106, and black perovskite crystals grow on the crystal seed by the crystallization process while the solvent slowly evaporates from the mixture.

Similar to the first experimental example, steps S100 to S106 are carried out with a temperature maintained at about 165° C. The perovskite crystal obtained in the second experimental example may reach a size larger than 1 cm within one day. The $FA_xMA_{(1-x)}PbI_3$ crystal formed in the second experimental example and the $MAPbI_3$ crystal formed in the first experimental example may be similar in shape.

After obtaining a $FA_xMA_{(1-x)}PbI_3$ crystal by the second experimental example, the properties of such a crystal are tested. The results show that the single crystal has excellent heat resistance and moisture resistance. In addition, by using MAI/FAI precursor having a specific MAI/FAI ratio, the formed $FA_xMA_{(1-x)}PbI_3$ crystal with a specific FA/MA ratio could have an band gap of about 1.41 eV, and would be suitable for photovoltaic application Specifically, as shown in FIG. 5 to FIG. 9, tests for evaluating the energy gap, the heat-resistance and the moisture resistance of the product of the second experimental example are carried out.

Figure 5:
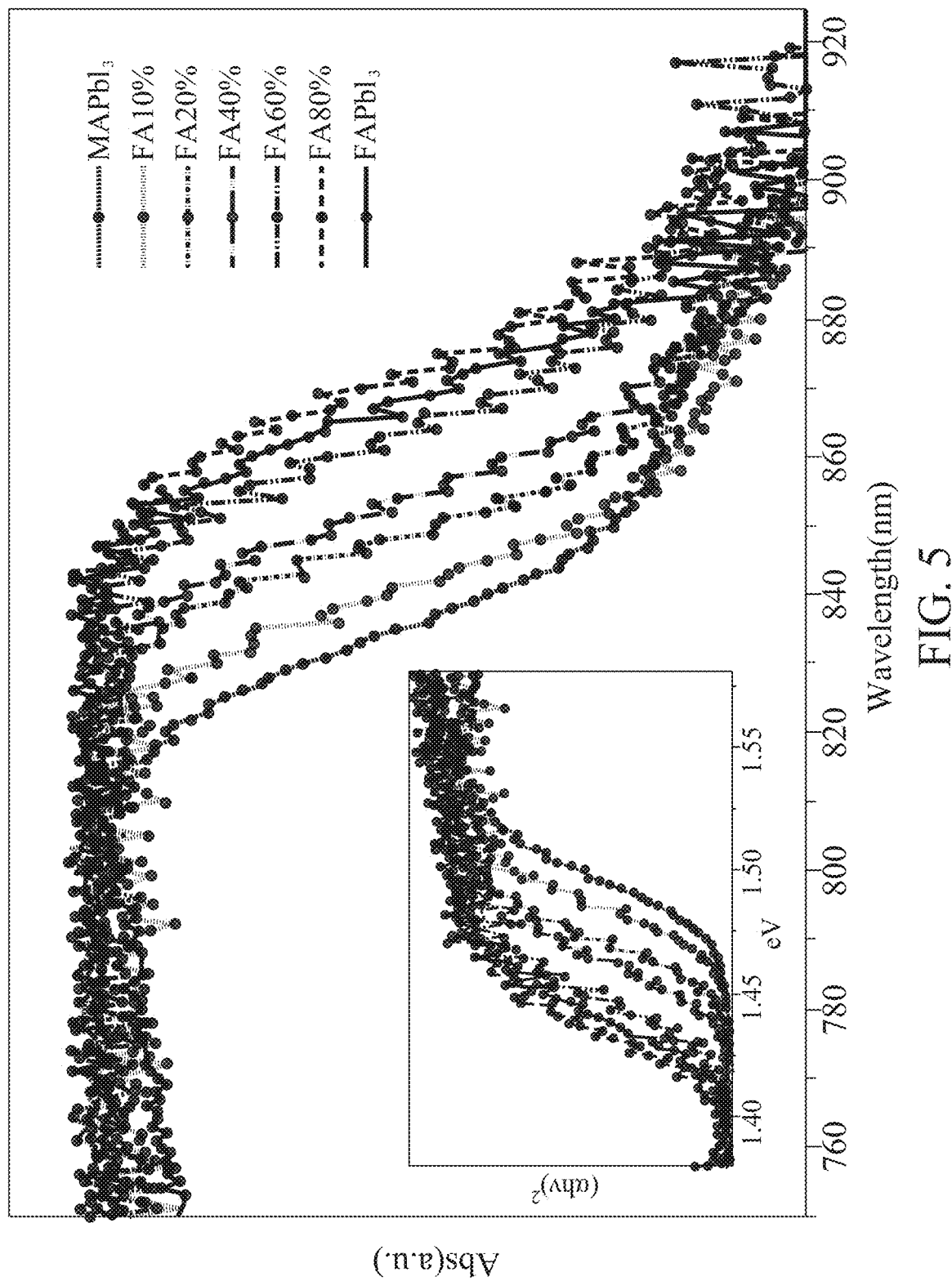
FIG. 5 is the absorption diagrams of the $FA_XMA_{(1-X)}PbI_3$ single crystals formed by precursors having different FA/MA ratios.
Figure 6:
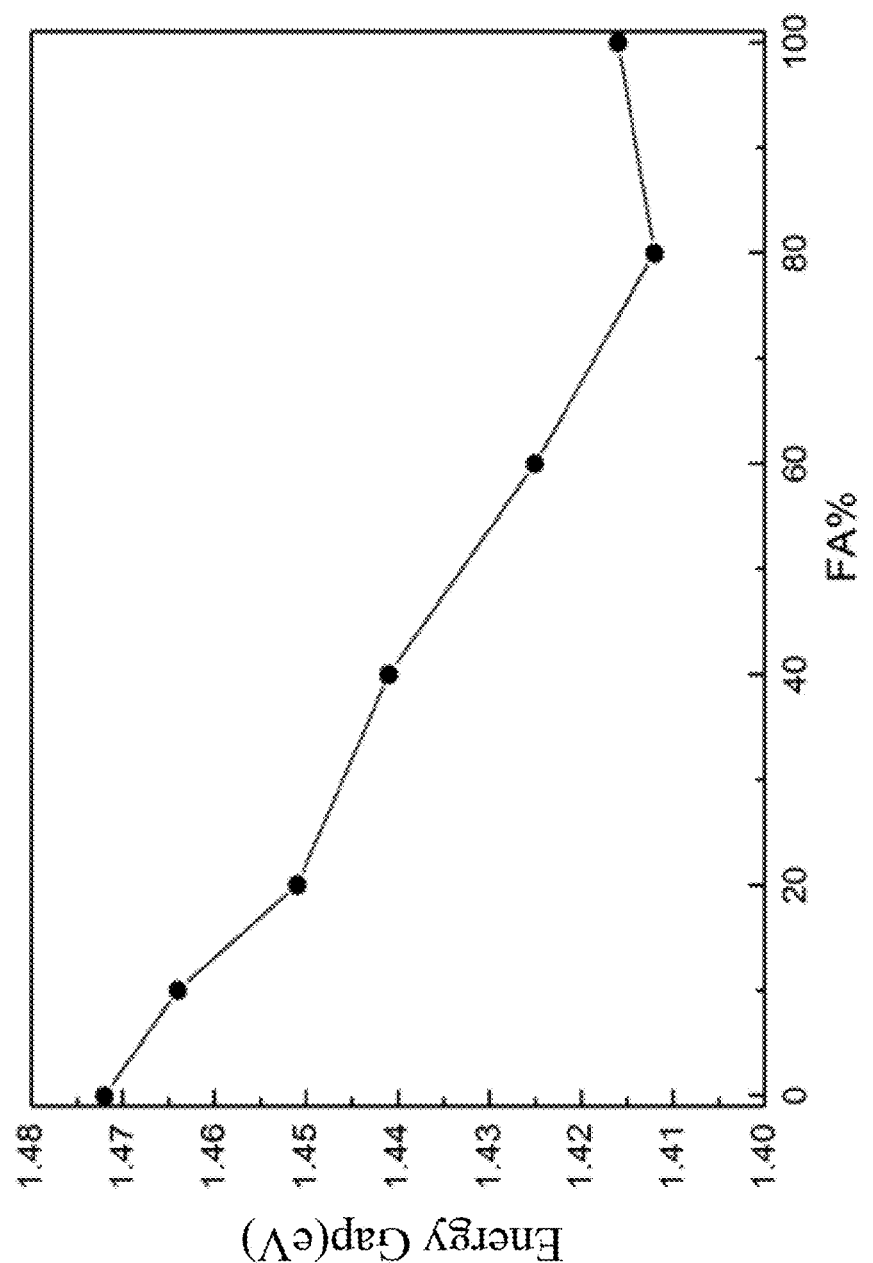
FIG. 6 shows the variation of the band gaps of the $FA_XMA_{(1-X)}PbI_3$ single crystals formed by precursors having different FA/MA ratios.

Reference is made to FIG. 5 and FIG. 6. FIG. 5 shows the absorption diagrams of the $FA_xMA_{(1-x)}PbI_3$ single crystals formed by precursors having a different FA/MA ratio, and FIG. 6 shows the variation of the energy gaps of the $FA_xMA_{(1-x)}PbI_3$ single crystals formed by precursors having a different FA/MA ratio. As shown in FIG. 5, when the molar percentage of the FA in the precursor increases, the absorption spectrum is redshift, which indicates that the material (crystal) has a larger absorption range toward sunlight. Therefore, the solar cell manufactured from the material could have higher short circuit current. As shown in FIG. 6, when the molar ratio of the FA in the precursor is about 80%, the $FA_xMA_{(1-x)}PbI_3$ crystal has an energy gap of about 1.41 eV. Such product could be represented by $FA_xMA_{(1-x)}PbI_3$, where X is 0.8.

Figure 7:
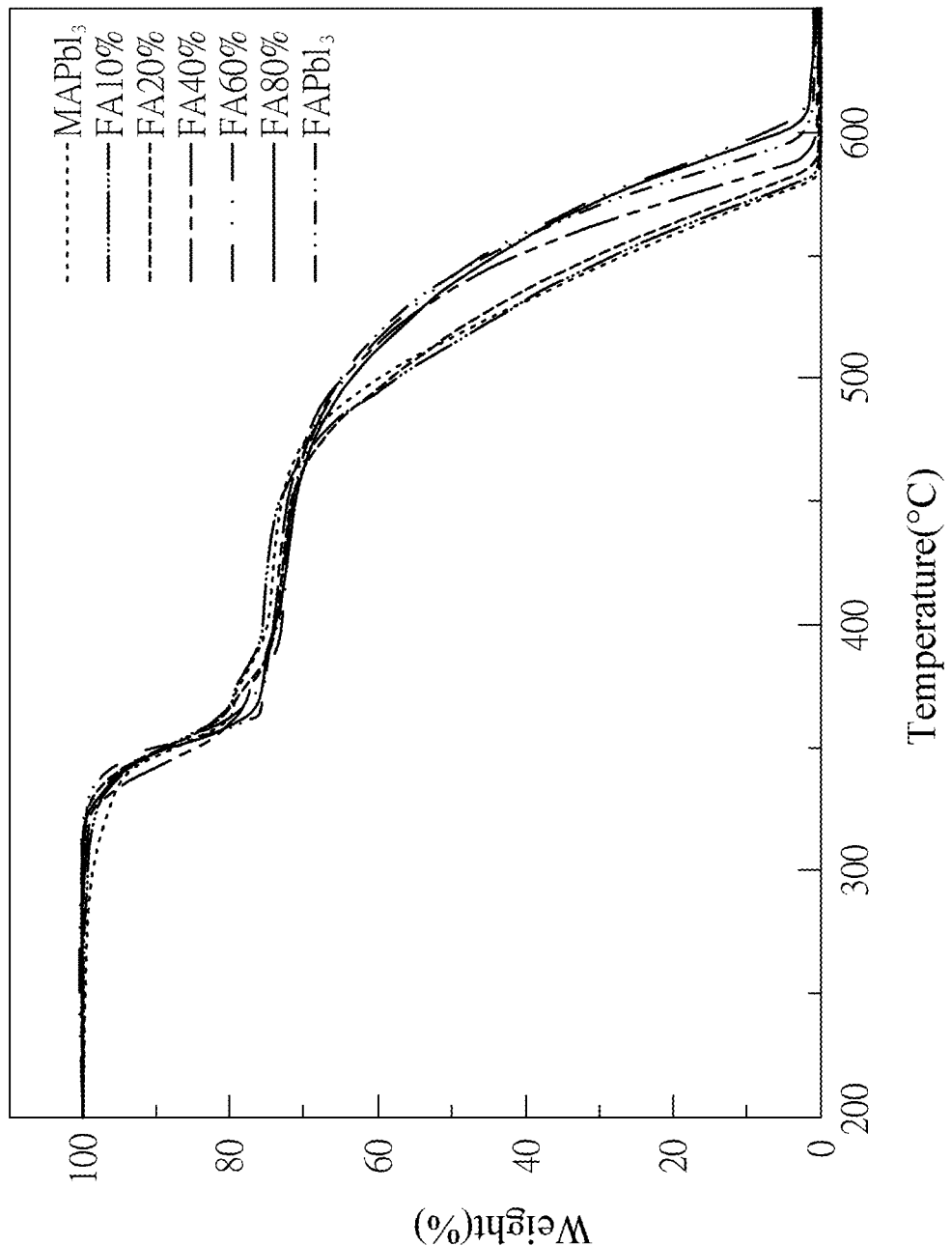
FIG. 7 shows the thermogravimetric analysis results of the $FA_XMA_{(1-X)}PbI_3$ single crystals formed by precursors having a different FA/MA ratios.
Figure 8:
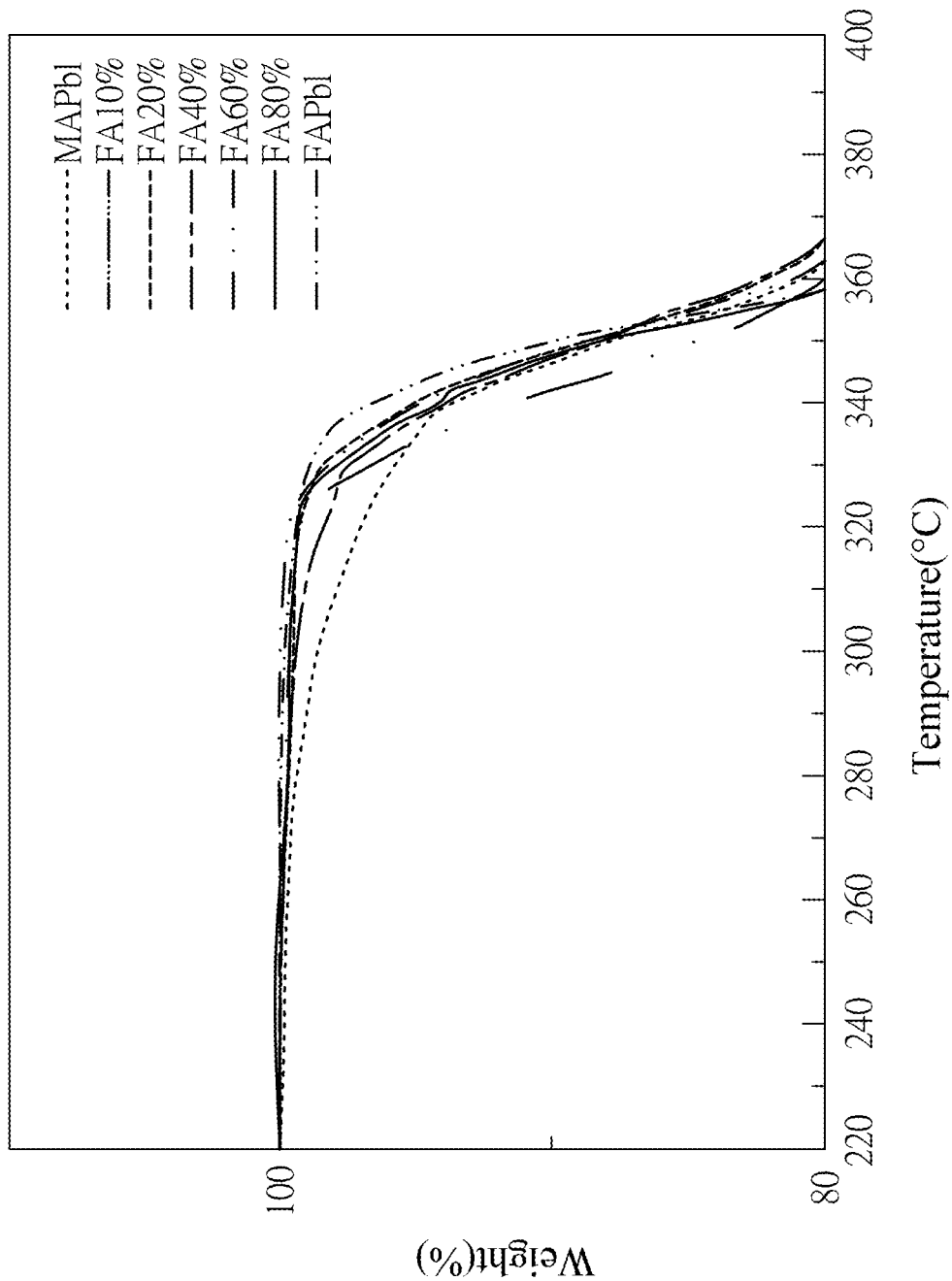
FIG. 8 is a partial enlarged view of FIG. 7 in the range of 220 to 400° C.

Regarding the heat resistance test, FIG. 7 shows the thermogravimetric analysis (TGA) results of the $FA_XMA_{(1-X)}PbI_3$ single crystals formed by precursors having a different FA/MA ratio, and FIG. 8 is a partial enlargement view of FIG. 7 in the range of 220 to 400° C. The heat resistance test is carried out with nitrogen atmosphere. As shown in FIG. 8, comparing to a $MAPbI_3$ single crystal, the $FA_XMA_{(1-X)}PbI_3$ single crystals prepared using precursors having a different FA/MA ratio have higher starting decomposing temperature. Therefore, the $FA_XMA_{(1-X)}PbI_3$ single crystals have better heat-resistance property.

Figure 9:
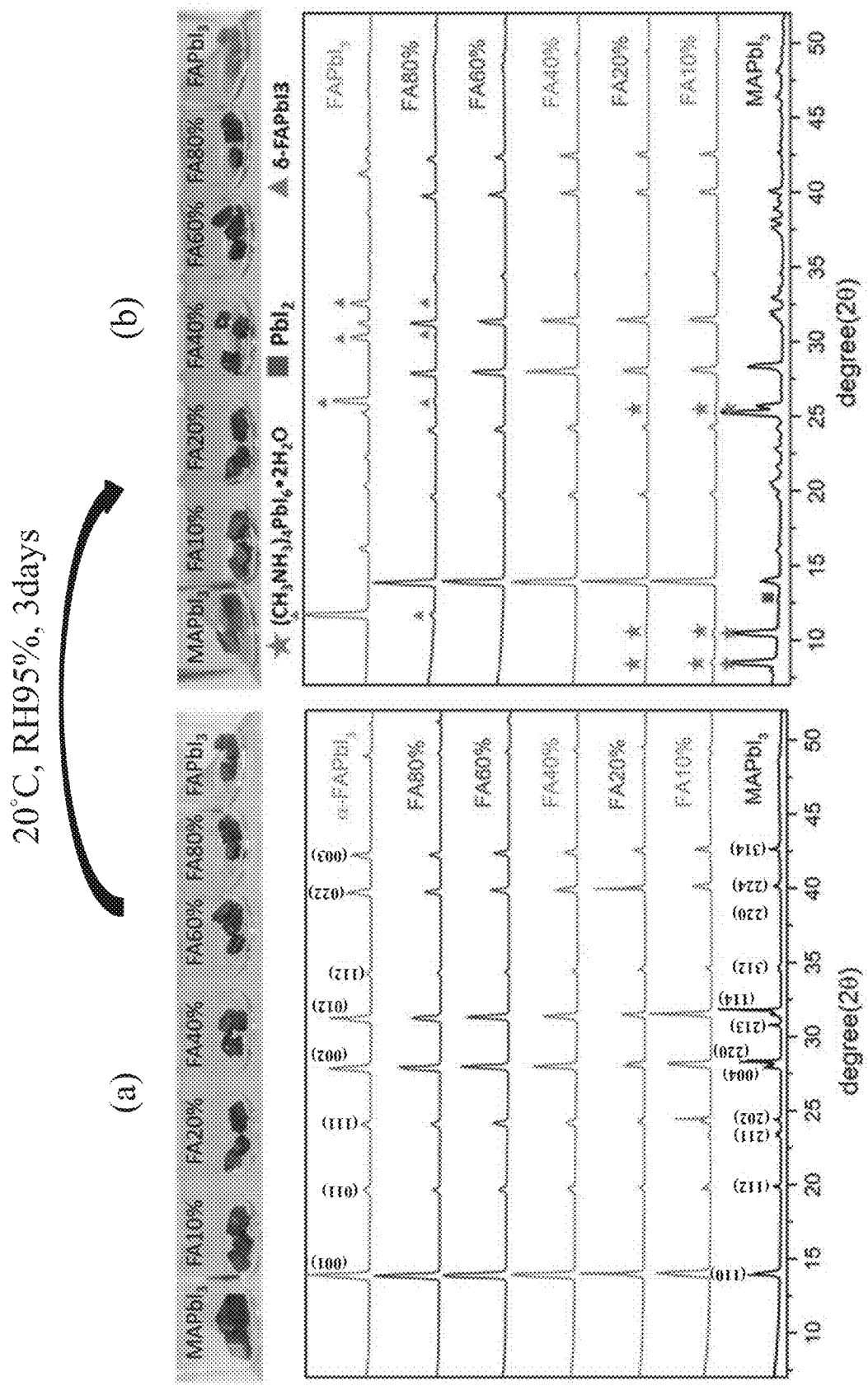
FIG. 9 shows the results of moisture-resistant property of the $FA_XMA_{(1-X)}PbI_3$ single crystals formed by precursors having a different FA/MA ratio.

Lastly, regarding the moisture resistance test, FIG. 9 shows the results of moisture-resistant property of the $FA_XMA_{(1-X)}PbI_3$ single crystals formed by precursors having a different FA/MA ratio. FIG. 9(a) includes the photos of the $FAMAPbI_3$ single crystals formed by precursors having a different FA/MA ratio at the initial state and the corresponding XRD diagram. FIG. 9(b) includes the photos and the XRD diagram of the $FA_XMA_{(1-X)}PbI_3$ single crystals after leaving the single crystals at an environment temperature of 20° C. and a relative humidity of 85% for three days. In other words, FIGS. 9(a) and 9(b) shows the single crystals before and after contacting moisture respectively.

As shown in FIG. 9, after the $FA_XMA_{(1-X)}PbI_3$ single crystal contacts moisture, the surface thereof has a yellowish color and the core thereof is black, but the $FAPbI_3$ single crystal becomes entirely yellow. However, the mixed cationic single crystal $FA_XMA_{(1-X)}PbI_3$ does not have apparent color change. Therefore, using both MA and FA as the first precursor P1 for forming the perovskite crystal may produce a single crystal with better moisture resistance property.

In addition, as shown in the XRD diagrams, the peak of $FA_XMA_{(1-X)}PbI_3$ does not change significantly after contacting moisture. Therefore, the $FA_XMA_{(1-X)}PbI_3$ crystal is less likely to form other compounds after contacting water. Particularly, with the FA/MA ratio ranging from 60/40 to 40/60, there is no new peak shown in the XRD diagram, which indicates the absence of new compounds. The stars, squares and triangles marked in the XRD diagrams represent the peak of $(CH_3NH_3)_4PbI_6 \cdot 2H_2O$, $PbI_2$ and $\delta$-$FAPbI_3$ which are not perovskite crystals.

The advantages of the instant disclosure resides in that the method for preparing perovskite crystal may significantly reduce the time for forming a clear solution containing the precursors, and increase the regularity and growing speed of the crystal by the technical features of "adding a first precursor and a second precursor into a solvent for forming a supersaturated solution", "stirring the supersaturated solution for initiating a reaction between the first precursor and the second precursor in the supersaturated solution to form a perovskite powder in a solution", "adding more of the solvent to the solution while stirring the solution for dissociating the perovskite powder in the solution to form a clear solution" and "adding a crystal seed into the clear solution for initiating a crystallization process on the crystal seed and forming the perovskite crystal".

Specifically, the method of preparing perovskite crystal provided by the instant disclosure includes the mixing step, the crystallization step and the diluting step carried out under specific conditions which replace the step of dissolving the precursors in the solvent used in the existing art. In other words, the instant disclosure employs technical means that takes shorter time for forming the precursor solution of the crystallization.

Moreover, in the diluting step, in addition to adding solvent for forming an unsaturated clear solution, stirring is performed with a specific temperature range for effectively removing water remained in the solvent. Therefore, in the subsequent steps, the nucleation path of the perovskite crystal is limited and the crystal regularity of the perovskite crystal is increased. The perovskite crystals formed by the method provided by the instant disclosure have larger probability to grow on the seed crystal, i.e., the resources provided by the precursor solution are concentrated on the crystal seed for forming perovskite crystals with larger size and suitable for solar cell applications.

The above-mentioned descriptions represent merely the exemplary embodiment of the instant disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A method for preparing a perovskite crystal, including:
a crystallization step including stirring a supersaturated solution to form a resulting solution containing a perovskite powder, wherein the supersaturated solution is formed by adding a first precursor and a second precursor into a solvent, and the perovskite powder is formed from a reaction between the first precursor and the second precursor;
a diluting step including adding the solvent to the resulting solution and stirring the resulting solution for dissolving the perovskite powder in the resulting solution to directly form a clear solution, the clear solution is an unsaturated solution; and
a recrystallization step including adding a crystal seed into the clear solution for initiating a crystallization process on the crystal seed and forming the perovskite crystal.

2. The method according to claim 1, wherein the first precursor includes a halide having a general formula AX, and the second precursor includes a metal halide having a general formula $MX_2$, A being selected from the group consisting of $CH(NH_2)_2$, $CH_3CH_2NH_3$, $CH_3NH_3$ and Cs, M being selected from the group consisting of Pb and Sn, and X being selected from the group consisting of Cl, Br and I.

3. The method according to claim 2, wherein the first precursor includes at least two halides having a general formula AX, and A includes at least two selected from the group consisting of $CH(NH_2)_2$, $CH_3CH_2NH_3$, $CH_3NH_3$ and Cs.

4. The method according to claim 1, wherein the solvent is γ-butyrolactone, dimethylformamide or a mixture thereof.

5. The method according to claim 1, wherein the crystallization step are carried out with a temperature ranging from 57 to 204° C.

6. The method according to claim 1, wherein the diluting step is carried out with a temperature ranging from 100 to 204° C.

7. The method according to claim 1, wherein the recrystallization step is carried out with a temperature ranging from 80 to 204° C.

8. The method according to claim 1, wherein the first precursor is $CH_3NH_3I$ and the second precursor is $PbI_2$, wherein a molar ratio between the first precursor and the second precursor ranges from 1:1 to 3:1.

9. The method according to claim 8, wherein the solvent is γ-butyrolactone, and the recrystallization step is carried out with a temperature ranging from 80 to 204° C.

10. A method for preparing a perovskite crystal, including:

stirring a supersaturated solution to form a resulting solution containing to form a perovskite powder; wherein the supersaturated solution is formed by adding a first precursor and a second precursor into a solvent;

adding more of the solvent to the resulting solution for dissolving the perovskite powder and directly forming a clear solution, the clear solution is an unsaturated solution; and adding a crystal seed into the clear solution for forming the perovskite crystal.

11. The method according to claim 10, wherein the first precursor includes a halide, and the second precursor includes a metal halide.

12. The method according to claim 10, wherein the solvent includes γ-butyrolactone, dimethylformamide or a mixture thereof.

13. The method according to claim 10, wherein the supersaturated solution is stirred at a temperature ranging from 57 to 204° C.

14. The method according to claim 10, wherein the solvent is added to the solution at a temperature ranging from 100 to 204° C. for forming the clear solution.

15. A method for preparing a perovskite crystal, including:

stirring a supersaturated solution to form a resulting solution containing a perovskite powder; wherein the supersaturated solution is formed by adding enough amount of a first precursor and a second precursor into a solvent;

adding more of the solvent to the resulting solution for dissolving the perovskite powder until the resulting solution directly becomes clear and unsaturated; and adding a crystal seed into the resulting solution which is clear for forming the perovskite crystal.

16. The method according to claim 15, wherein the first precursor includes a halide, and the second precursor includes a metal halide, and the solvent includes γ-butyrolactone, dimethylformamide or a mixture thereof.

17. The method according to claim 16, wherein the first precursor having a general formula AX, and the second precursor having a general formula $MX_2$, A being selected from a group consisting of $CH(NH_2)_2$, $CH_3CH_2NH_3$, $CH_3NH_3$ and Cs, M being selected from a group consisting of Pb and Sn, and X being selected from a group consisting of Cl, Br and I.

18. The method according to claim 15, wherein the first precursor is $CH_3NH_3I$ and the second precursor is $PbI_2$, and a molar ratio between the first precursor and the second precursor ranges from 1:1 to 3:1.

* * * * *